United States Patent
Christensen

(10) Patent No.: US 7,341,804 B2
(45) Date of Patent: Mar. 11, 2008

(54) ANODE COMPOSITIONS HAVING AN ELASTOMERIC BINDER AND AN ADHESION PROMOTER

(75) Inventor: Leif Christensen, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 774 days.

(21) Appl. No.: 10/251,067

(22) Filed: Sep. 20, 2002

(65) Prior Publication Data

US 2004/0058240 A1    Mar. 25, 2004

(51) Int. Cl.
*H01M 8/00*      (2006.01)

(52) U.S. Cl. .................................. 429/231.94

(58) Field of Classification Search .............. 429/218.1, 429/231.1, 223, 224, 209, 231.95; 29/623.1
See application file for complete search history.

(56) References Cited

U.S. PATENT DOCUMENTS

| | | | |
|---|---|---|---|
| 4,814,242 A | 3/1989 | Maxfield et al. | |
| 5,262,255 A | 11/1993 | Ito et al. | |
| 5,571,638 A | 11/1996 | Satoh et al. | |
| 6,203,944 B1 | 3/2001 | Turner et al. | |
| 6,225,003 B1 | 5/2001 | Krawiec et al. | |
| 6,235,427 B1 * | 5/2001 | Idota et al. .............. | 429/218.1 |
| 2001/0033973 A1 | 10/2001 | Krause et al. | |
| 2002/0122950 A1 * | 9/2002 | Ehrlich et al. .............. | 428/463 |

FOREIGN PATENT DOCUMENTS

| | | |
|---|---|---|
| EP | 1313158 | 5/2003 |
| JP | 04188560 | 7/1992 |
| JP | 9-50809 | 2/1997 |
| JP | 09223501 | 8/1997 |
| JP | 10241678 | 9/1998 |
| JP | 11-354104 | 12/1999 |
| JP | 2001-6683 | 1/2001 |
| WO | WO 01/99127 | 12/2001 |

* cited by examiner

*Primary Examiner*—Patrick Joseph Ryan
*Assistant Examiner*—Monique Will
(74) *Attorney, Agent, or Firm*—Lucy C. Weiss; Dorothy P. Whelan; Dean M. Harts

(57) ABSTRACT

An anode composition that includes an elastomeric polymer binder, a plurality of electrochemically active metal particles dispersed in the binder, an electrically conductive diluent, and an adhesion promoter that promotes adhesion among the particles, the diluent, and the binder. Also featured are lithium ion batteries featuring anodes made from these compositions.

22 Claims, 4 Drawing Sheets

US 7,341,804 B2

ANODE COMPOSITIONS HAVING AN ELASTOMERIC BINDER AND AN ADHESION PROMOTER

TECHNICAL FIELD

This invention relates to anode materials useful in secondary lithium batteries.

BACKGROUND OF THE INVENTION

Two classes of materials have been proposed as anodes for secondary lithium batteries. One class includes materials such as graphite and other forms of carbon, which are capable of intercalating lithium. While the intercalation anodes generally exhibit good cycle life and coulombic efficiency, their capacity is relatively low.

A second class includes metals that alloy with lithium metal. Although these alloy-type anodes generally exhibit higher capacities relative to intercalation-type anodes, they suffer from relatively poor cycle life and coulombic efficiency. One reason is that the alloy-type anodes undergo large volume changes during charge and discharge. This results in the deterioration of electrical contact between the active particles, conductive diluent (e.g., carbon) particles, and binder that form the anode. The deterioration of electrical contact, in turn, results in diminished capacity and rate capability over the cycle life of the anode.

SUMMARY OF THE INVENTION

The invention provides anode compositions suitable for use in secondary lithium batteries in which the anode compositions have high initial capacities that are retained even after repeated cycling. The anode compositions, and batteries incorporating these compositions, are also readily manufactured. To achieve these objectives, the invention features an anode composition that includes a plurality of electrochemically active metal particles dispersed in an elastomeric polymer binder along with an electrically conductive diluent, and an adhesion promoter that promotes adhesion among the active particles, the diluent, and the binder. An "electrochemically active metal particle" is a metal particle hat eacts with lithium under conditions typically encountered during charging and discharging in a lithium battery.

Lithium batteries including the above-described anode compositions may be used as power supplies in a variety of applications. Examples include power supplies for motor vehicles, computers, power tools, and telecommunications devices.

Other features and advantages of the invention will be apparent from the following description of the preferred embodiments thereof, and from the claims.

DETAILED DESCRIPTION

Figure 1:
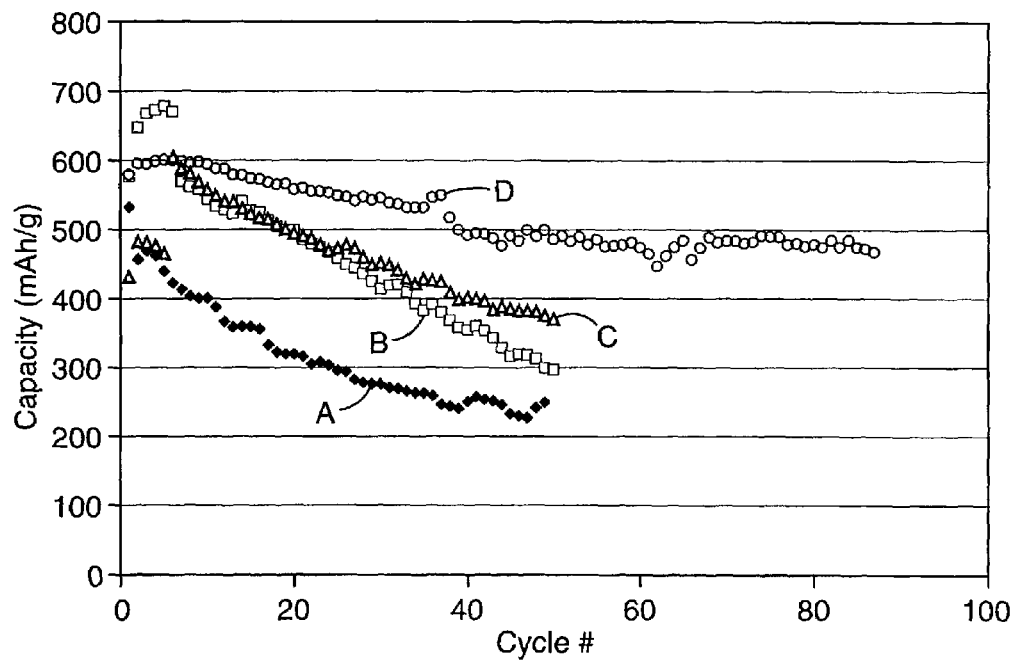
FIG. 1 shows a plot of charge capacity versus cycle number for cells described in Example 1 and Comparative Examples 1, 2, and 3.

The anode compositions include a plurality of electrochemically active metal particles and an electrically conductive diluent dispersed in an elastomeric polymer binder, and an adhesion promoter that promotes adhesion among the active particles, the diluent, and the binder. The combination of an adhesion promoter and elastomeric polymer binder accommodates volume changes realized during cycling, thereby minimizing the deterioration of electrical contact that would otherwise occur and cause diminished capacity and rate capability over the cycle life of the anode.

Examples of suitable electrochemically active metal particles include metal alloy particles of the type described in Turner et al., U.S. Pat. No. 6,203,944; Turner, U.S. Pat. No. 6,255,017; Turner et al., U.S. Ser. No. 09/751,169 filed Dec. 29, 2000 and entitled "Amorphous Electrode Compositions;" and Krause et al., U.S. Ser. No. 09/883,865 filed Jun. 18, 2001 and entitled "Electrode Compositions Having Improved Cycling Behavior." Each of these patents and patent applications is assigned to the same assignee as the present application and are hereby incorporated by reference in their entirety.

Of particular interest are the composite particles described in the aforementioned Krause et al., U.S. Ser. No. 09/883, 865 application. These composite particles include an electrochemically active metal particle and an electrically conductive layer partially covering the metal particle. In one aspect, the layer is present in an amount no greater than about 75 wt. % of the composite particle. Preferably, the layer is present in an amount no greater than about 50 wt. % of the composite particle, and may be present in an amount no greater than about 25 wt. % of the composite particle. In a second aspect, the layer is present in an amount no greater than about 75 vol. % of the composite particle, and may be present in an amount no greater than about 50 vol. % or 25 vol. % of the composite particle. The layer improves the efficiency of the anode by reducing the deterioration of electrical contact between the electrochemically active metal particles and the electrically conductive diluent particles during cycling.

An "electrochemically active metal" is a metal that reacts with lithium under conditions typically encountered during charging and discharging in a lithium battery. In contrast, an "electrochemically inactive metal" is a metal that does not react with lithium under those conditions. In both cases, the term "metal" includes materials such as silicon that are sometimes referred to as "metalloids."

An "electrically conductive layer" is a layer having a bulk electrical conductivity at least in the semi-conducting range, e.g., on the order of about $10^{-6}$ $ohm^{-1}$ $cm^{-1}$ or greater.

The expression "partially covering" means that the layer, when the composite particle is contacted with an electrolyte that includes a lithium electrolyte salt, allows the electrolyte to access the underlying metal particle. In some cases, this involves an arrangement in which the layer is in the form of a discontinuous coating on the particle such that the underlying metal particle material is detectable using x-ray photoelectron spectroscopy (XPS). In other cases, the layer may be porous to enable the electrolyte to penetrate the layer and access the underlying metal particle. Porosity is defined and calculated as described in the aforementioned Krause et al., U.S. Ser. No. 09/883,865 application. Preferably, the layer has a porosity on the order of about 90%.

Examples of suitable metals for the electrochemically active metal particle include silver, aluminum, silicon (e.g., amorphous silicon), tin, antimony, lead, germanium, magnesium, zinc, cadmium, bismuth, and indium. The particle may include one or more of these metals. The particle may also include one or more electrochemically inactive metals. Examples of suitable electrochemically inactive metals include Group IB through Group VIIB elemental metals, as well as group VIII and rare earth elemental metals. Specific examples include Ti, V, Cr, Mn, Fe, Co, Ni, Cu, Y, Zr, Nb, Mo, La, Hf, Ta, W, Ce, Pr, Nd, Eu, Gd, Tb, Dy, Ho, Er, Yb, Lu, Be, and Sm. Of this group, molybdenum, niobium, tungsten, tantalum, iron, nickel, manganese, and copper are preferred.

Examples of suitable materials for the electrically conductive layer include metals such as copper, chromium, nickel, silver, and combinations thereof.

The elastomeric polymer binder preferably is a fluoroelastomer binder. Examples of suitable fluoroelastomer binders include fluoroelastomers having units derived from monomers such as olefins (e.g., ethylene, propylene, or butylene), fluoroolefins (e.g., vinylidene fluoride), perfluoroolefins (e.g., hexafluoropropylene), perfluoroalkyl vinyl ethers, perfluoroalkoxy vinyl ethers, and combinations thereof. Specific examples include terpolymers of vinylidene fluoride, tetrafluoroethylene, and propylene, and copolymers of vinylidene fluoride and hexafluoropropylene. Commercially available fluoroelastomers include those sold under the trade designations FC-2178, FC-2179, and BRE-7131X (Dyneon, LLC, Oakdale, Minn.).

The elastomeric polymer binder preferably is crosslinked. Crosslinking not only improves the mechanical properties of the polymer, but also helps provide good contact between the active particles and the electrically conductive diluent.

The electrically conductive diluent included in the anode composition aids in transferring electrons from the electrochemically active metal particles to the current collector. Examples of useful diluents include finely powdered carbon materials, metals, metal nitrides, metal carbides, metal silicides, and metal borides. Examples of suitable carbon materials include Super P and Super S carbon black from MMM Carbon of Belgium, Shawanigan Black from Chevron Chemical Co. of Houston, Tex., acetylene black, furnace black, lamp black, graphite, and carbon fibers.

The anode composition includes an adhesion promoter that promotes adhesion among the electrochemically active metal particles, the conductive diluent, and the binder. The adhesion promoter may form part of the binder (e.g., in the form of a functional group) or may be in the form of a coating applied to the surface of the electrochemically active metal particles. Examples of materials for the latter are well-known, and include silanes, titanates, and phosphonates.

Examples of useful silanes include vinyltriethoxy-silane, vinyltrimethoxysilane, vinyltrichlorosilane, vinyltris(2-methoxyethoxy) silane, γ-methacryloxypropyltrimethoxysilane, γ-methacryloxypropyl-triethoxysilane, γ-aminopropyltriethoxysilane, γ-aminopropyltrimethoxysilane, N-β-(aminoethyl)-γ-aminopropyltrimethoxysilane, N-β-(aminoethyl)-γ-aminopropyltriethoxysilane, γ-ureidopropyltriethoxy-silane, γ-ureidopropyltrimethoxysilane, β-(3,4-epoxycyclohexyl)-ethyltrimethoxysilane, β-(3,4-epoxycyclohexyl)ethyltriethoxysilane, γ-glycidoxypropyltrimethoxysilane, γ-glycidoxypropyltriethoxysilane, γ-mercaptopropyltrimethoxysilane, γ-mercaptopropyltriethoxysilane, γ-chloropropyltrimethoxysilane, γ-chloropropyltriethoxysilane, methyltriethoxysilane, methyltrimethoxysilane, phenyltriethoxysilane and phenyltrimethoxysilane.

Examples of useful titanates include titanium N-(triethanolaminato)-isopropoxide and those commercially available from Dupont (Wilmington, Del.) under the trade designation TYZOR. Additional examples include isopropyl triisostearoyl titanate, isopropyl tridodecylbenzenesulfonyl titanate, isopropyl tris(dioctylpyrophosphate)titanate, tetraisopropyl bis(dioctylphosphite)titanate, tetraoctyl bis(ditridecylphosphite) titanate, tetra(2,2-diallyloxymethyl)bis (ditridecyl)phosphite titanate, bis(dioctylpyrophosphate) oxyacetate titanate, bis(dioctylpyrophosphate) ethylene titanate, isopropyltrioctanoyl titanate, isopropyl dimethacryl isostearoyl titanate, isopropyl isostearoyl diacryl titanate, isopropyl tri(dioctylphosphate)titanate, isopropyl tricumylphenyl titanate, isopropyl tri(N-aminoethyl)titanate, dicumyl phenyloxyacetate titanate, and diisostearoylethylene titanate.

Examples of useful phosphonates include 1-hydroxyethylene-1,1-diphosphonic acid. The anode compositions preferably contain at least 50% by weight of electrochemically active metal particles, and preferably at least 75% by weight of these particles. Where the adhesion promoter is included as a coating for the electrochemically active metal particles, it is present in an amount ranging from about 0.1 to 20 parts per 100 parts by weight of the electrochemically active metal particles, and preferably between 1 and 10 parts per 100 parts by weight of the electrochemically active metal particles. The coating may fully or partially cover the surface of the particles.

The anode compositions are particularly useful in lithium ion batteries. To prepare a battery, the anode composition, in the form of a solvent-based slurry, is coated on a backing using conventional coating techniques and dried to form the anode. The anode is then combined with an electrolyte and a cathode.

The electrolyte may be a solid or liquid electrolyte. Examples of solid electrolytes include polymeric electrolytes such as polyethylene oxide, polytetrafluoroethylene, fluorine-containing copolymers, and combinations thereof. Examples of liquid electrolytes include ethylene carbonate, diethyl carbonate, propylene carbonate, and combinations thereof. The electrolyte is provided with a lithium electrolyte salt. Examples of suitable salts include $LiPF_6$, $LiBF_4$, and $LiClO_4$.

Examples of suitable cathode compositions for liquid electrolyte-containing batteries include $LiCoO_2$, $LiCO_{0.2}Ni_{0.8}O_2$, and $LiMn_2O_4$. Examples of suitable cathode compositions for solid electrolyte-containing batteries include $LiV_3O_8$ and $LiV_2O_5$.

The invention will now be described further by way of the following examples.

EXAMPLES

A. Sputtering Procedure

Si/Sn electrochemically active metal particles were prepared by sputtering, as follows.

A sputter coater was equipped with a 6-inch long water-cooled sputtering target of composition Si (63 st. %), Sn (33 at. %), and Cu (4 at. %). The target was situated concentrically inside a 4-inch diameter (ID) copper cylinder. The coater was evacuated using a CTI-CRYOGENICS ON-BORD® high vacuum cryo pump and a Leybold high vacuum turbo pump model 220 backed by a conventional roughing pump. The target was powered by an ADVANCED ENERGY MDX II dc power supply operated at 5.5 kW. During sputtering in an argon atmosphere at a partial pressure of about 8.5 mTorr, a layer of amorphous alloy was deposited on the inside walls of the cylinder. At the completion of the sputtering run, the cylinder was removed from the sputtering chamber and the deposit cryogenically released from the cylinder to produce flakes. The flakes were then milled and sized to create particles for use in anode preparation.

B. Melt Spinning Procedure

Al/Mn/Si electrochemically active metal particles were produced by melt spinning, as follows.

Ingots of composition Al (61 at. %), Mn (9 at. %), and Si (30 at. %) were purchased from Sophisticated Alloy Inc., Butler, Pa. A quartz tube was ground to create an orifice measuring 0.030 inch in diameter. Approximately 10 g of ingot chunks were placed in the tube, after which the tube was suspended in a copper coil inside a vacuum chamber. The tube was connected to a supply of pressurized argon. The nozzle of the tube was adjusted to a height of 0.048 inch between the nozzle tip and the surface of an 8-inch diameter Cu/Be wheel. The chamber was evacuated to 90 mTorr, and an overpressure of 100 Torr was maintained between an argon storage tank and the inside of the vacuum chamber. The Cu/Be wheel was rotated at a speed of 4500 rpm and a sufficient radio frequency power was supplied to the copper coil to melt the ingot pieces in the induction field. When the ingot pieces had liquefied, the molten metal was ejected onto the wheel surface by the argon tank supply pressure. The process produced a ribbon having a width of 1 to 2 mm, and a thickness of approximately 20 mils.

C. Electroless Plating Procedure

The following procedure produces an electrode having a 20% by weight silver plating on the core. Platings having different silver levels are prepared by varying the amount of plating reagent used.

A plating reagent was prepared by dissolving 0.26 grams of KOH in 100 ml of deionized water, followed by the addition of 1.32 ml of ammonium hydroxide and 0.59 grams of silver nitrate ($AgNO_3$). The combination of the silver nitrate and the ammonium hydroxide forms the active compound $Ag(NH_3)_2$ from which the silver is plated after the addition of a reducing sugar.

A 0.5 gram sample of the core material in the form of particles was placed in a vial with a 26 ml aliquot of the silver nitrate solution and stirred at a speed sufficient to keep the particulate material from settling out. The amount of reagent was selected to produce a plating having 20% silver by weight. The plating process was initiated by rapidly adding 6.6 mls of a 25 g/liter solution of dextrose to the swirling vortex of the stirred solution in order to disperse the reducing sugar quickly. The plating reaction started immediately and was allowed to progress at least 30 minutes under rapid agitation, after which a centrifuge was used to separate the particulate matter. The remaining spent solution was decanted away. After several water washes in the centrifuge, the plated material was allowed to dry in an oven at approximately 70° C. overnight. The resulting material was easily powdered and displayed a color change indicating a successful plating operation. Scanning electron microscopy was used to verify the success of the plating operation.

D. Cell Preparation and Cycling Procedure

Half cell 2325 size coin cells were constructed from composite coated foils using a lithium foil (about 300 micrometers thick, available from Aldrich Chemical Co. of Milwaukee, Wis.) as the anode. The cell was constructed using a 25 micrometer thick CELLGARD 2400 polyethylene separator, unless stated otherwise. The electrolyte was 1 molal $LiPF_6$ in a 1:2 w/w mixture of ethylene carbonate and diethyl carbonate. Copper spacers were used as current collectors and to fill void areas in the cell. The cells were cycled using a Maccor Battery Cycler.

We now describe the preparation and characterization of specific anodes.

Comparative Example 1

A slurry was produced by mixing 550 mg of 10-20 micron, silver-coated, amorphous Si/Sn particles, 350 mg mesocarbon microbead graphite particles (MCMB 10-28, available from Osaka Gas Chemical Co., Ltd., Japan), 1.66 g of a 6% solids solution containing 50:50 by weight polyvinylidene fluoride ("PVDF," available from DuPont under the trade designation KYNAR 461), SUPER P (SP) conductive carbon in NMP (N-methyl pyrrollidinone) (available from Aldrich, Milwaukee, Wis.), and 1 g of NMP. The mixture was stirred under high shear for 10 minutes, and then coated on a 0.5 mil Cu foil using a 10 mil gap notch bar coater. The coating was dried in vacuo for 4 hours at 110° C. to produce a composite coating having (by weight) 55% Si/Sn/Ag, 35% MCMB 10-28, 5% PVDF, and 5% SP carbon. This coating was calendered to a porosity of 45%, and then re-dried in vacuo for 4 hours at 110° C.

Half cells were produced from the coated foil as described above, and cycled in a voltage window between 0.28 V and 0.9 V using a 0.5 $mA/cm^2$ current density. The charge capacity versus cycle number performance for the cell (labeled as A) is shown in FIG. 1.

Comparative Example 2

The procedure of Comparative Example 1 was followed except that the particles were stirred in 1 g NMP with 60 mg of 3-aminopropyltrimethoxysilane adhesion promoter (available from Aldrich, Milwaukee, Wis.) for 10 minutes prior to addition of the MCMB, PVDF, and SP carbon components. The half cells were cycled in a voltage window between 0.20 V and 0.9 V using a 0.25 $mA/cm^2$ current density. The charge capacity versus cycle number performance for the cell (labeled as B) is shown in FIG. 1

Comparative Example 3

A polymer stock solution was produced by dissolving 20 g of fluoroelastomer BRE-7131X (available from Dyneon, LLC, Oakdale, Minn.) in 80 g of methyl ethyl ketone (MEK). Using a high shear mixer, 10 g of this solution was mixed with 2 g of SP carbon, 120 mg of MAGLITE Y (available from C. P. Hall Company, Bedford Park, Ill.), 40 mg of calcium hydroxide HP (available from C. P. Hall Company), and 38 g MEK for 30 minutes to produce a ~8% solids polymer/carbon suspension.

A slurry was produced by mixing 550 mg of 10-20 micron, silver-coated, amorphous Si/Sn particles, 350 mg MCMB 10-28, 1.25 g of the 8% solids polymer/carbon suspension, and 1 g MEK. The slurry was stirred under high shear for 10 minutes and then coated onto a Cu foil, dried at 110° C. for 24 hours, calendered to 60% porosity, and re-dried, as described in Comparative Example 1, to produce a coated foil anode.

Half cells were produced from the coated foil as described above and cycled in a voltage window between 0.25 V and 0.9 V using a 0.25 mA/cm$^2$ current density. The charge capacity versus cycle number performance for the cell (labeled as C) is shown in FIG. 1.

Example 1

550 mg of 10-20 micron, silver-coated, amorphous Si/Sn particles were stirred in 1 g MEK with 60 mg of 3-aminopropyltrimethoxysilane adhesion promoter for 10 minutes. Next, 350 mg of MCMB 10-28 and 1.25 g of an 8% solids solution of 50:50 by weight fluoroelastomer BRE-7131X and SP carbon in MEK (prepared as described in Comparative Example 3) were added. The resulting mixture was used to produce a coated Cu foil anode (foil thickness=12 microns) following the procedure described in Comparative Example 3. Half cells were produced from the coated foil as described above and cycled in a voltage window between 0.2 V and 0.9 V using a 0.25 mA/cm$^2$ current density. The charge capacity versus cycle number performance for the cell (labeled as D) is shown in FIG. 1.

The results shown in FIG. 1 demonstrate that the combination of an adhesion promoter and an elastomeric polymer binder results in anodes exhibiting improved performance with respect to charge capacity compared to anodes lacking the adhesion promoter (Comparative Example 3), the elastomeric polymer binder (Comparative Example 2), or both (Comparative Example 1).

Examples 2 to 5

Silver-coated, amorphous Si/Sn particles were combined with various adhesion promoters (AP1 through AP4, see Table 1) as described in Example 1, with the exception that the particles were stirred with the adhesion promoter for 4 days. Composite coatings were prepared and coated onto copper foil as described in Example 1.

TABLE 1

Adhesion Products used in Examples 2-5

| | | | |
|---|---|---|---|
| Example 2 | AP1 | 3-aminopropyltrimethoxysilane | Aldrich |
| Example 3 | AP2 | N-[3-trimethoxysilyl]propylethylenediamine | Aldrich |
| Example 4 | AP3 | 3-fluoropropyl trimethoxy silane | Aldrich |
| Example 5 | AP4 | Titanium N-(triethanolaminato)-isopropoxide | Aldrich |

Figure 2:
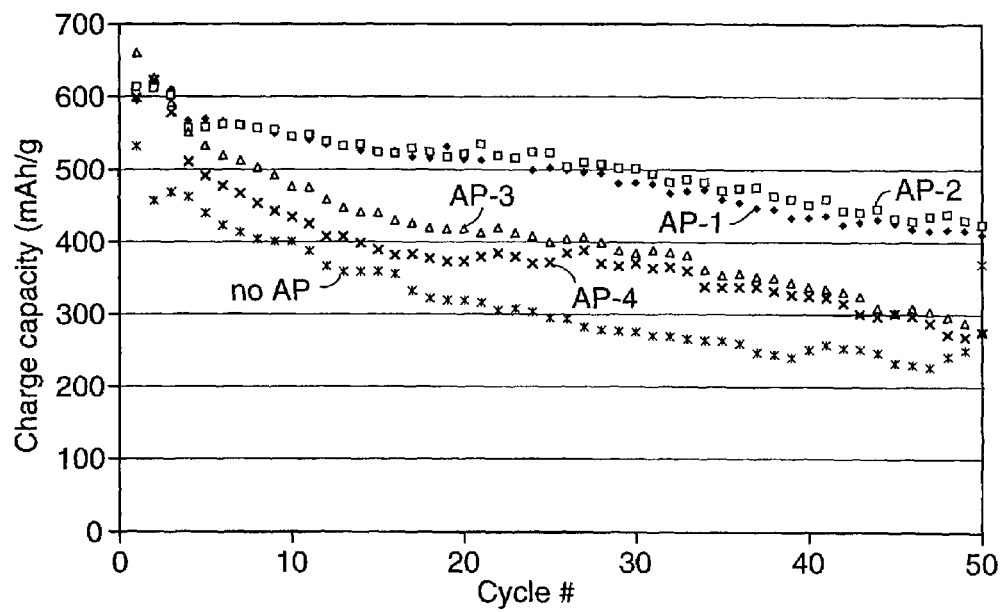
FIG. 2 shows a plot of charge capacity versus cycle number for cells described in Examples 2-5.

Cells were prepared and cycled as described in Example 1. The cycling results are shown in FIG. 2. The results shown in FIG. 2 demonstrate that each adhesion promoter, in combination with an elastomeric polymer binder, resulted in an anode that exhibited good performance, in terms of charge capacity versus cycle life. In particular, each anode offered superior performance relative to anodes prepared without the adhesion promoter and with a non-elastomeric polymer binder (Comparative Example 1).

Example 6

A polymer stock solution was produced by dissolving 40 g of fluoroelastomer FC-2178 (available from Dyneon, LLC, Oakdale, Minn.) in 160 g of MEK. Using a high shear mixer, 15 g of this solution was mixed with 7 g of SP carbon, 180 mg of MAGLITE Y, 90 mg of DIAK #3 amine curative (N,N'-dicinnamylidene-1,6-hexandediamine, available from R. T. Vanderbilt Company, Inc., Norwalk, Conn.), and 144 g MEK for 60 minutes to produce a ~6% solids carbon/polymer (70/30 w/w) suspension.

Figure 3:
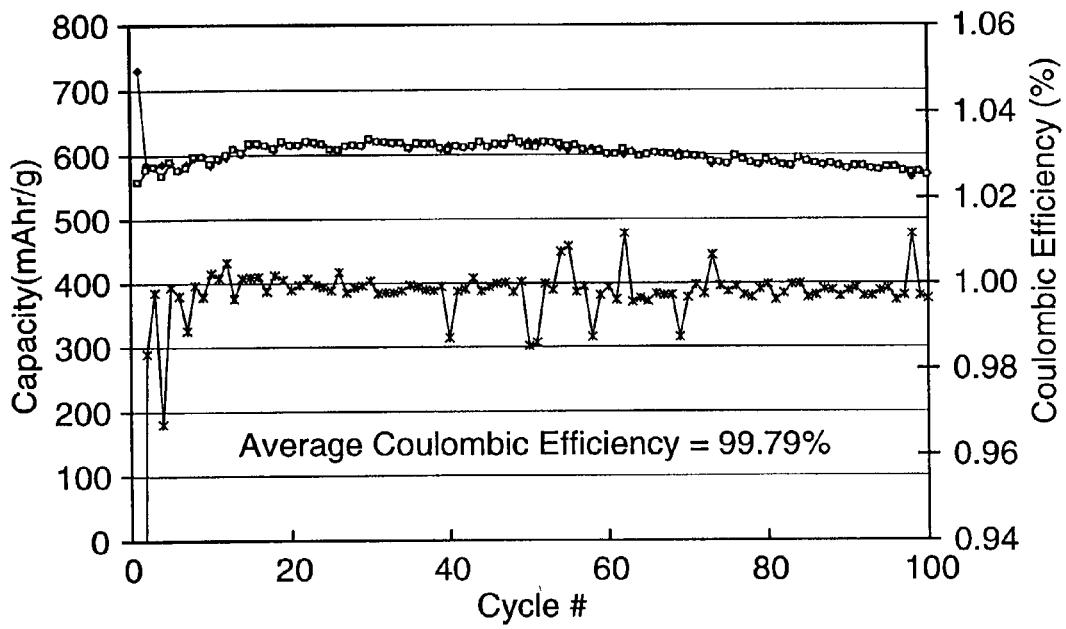
FIG. 3 shows a plot of charge capacity and coulombic efficiency versus cycle number for cells described in Example 6.

800 mg of 10-20 micron, silver-coated, amorphous Si/Sn particles were stirred in 1 g MEK with 80 mg of 3-aminopropyltrimethoxysilane adhesion promoter for 2 days at ambient temperature. Next, 3.34 g of the above 6% solids 70/30 SP/FC2178 suspension was added. The mixture was stirred under high shear for 5 minutes, and then coated on 12 micron Cu foil following the procedure of Example 1 to form a coated foil anode. Half cells were produced from the coated foil as described above and cycled in a voltage window between 0.25 V and 0.9 V using a 0.25 mA/cm$^2$ current density for the first 3 cycles, and then between 0.22 V and 0.9 V using a 0.50 mA/cm current density for one cycle. FIG. 3 shows the charge capacity and coulombic efficiency performance versus cycle number for the cells prepared in this example. The results demonstrate that the use of an amine-cured elastomeric polymer binder, in combination with an adhesion promoter, yield good cycling performance.

Example 7

Figure 4:
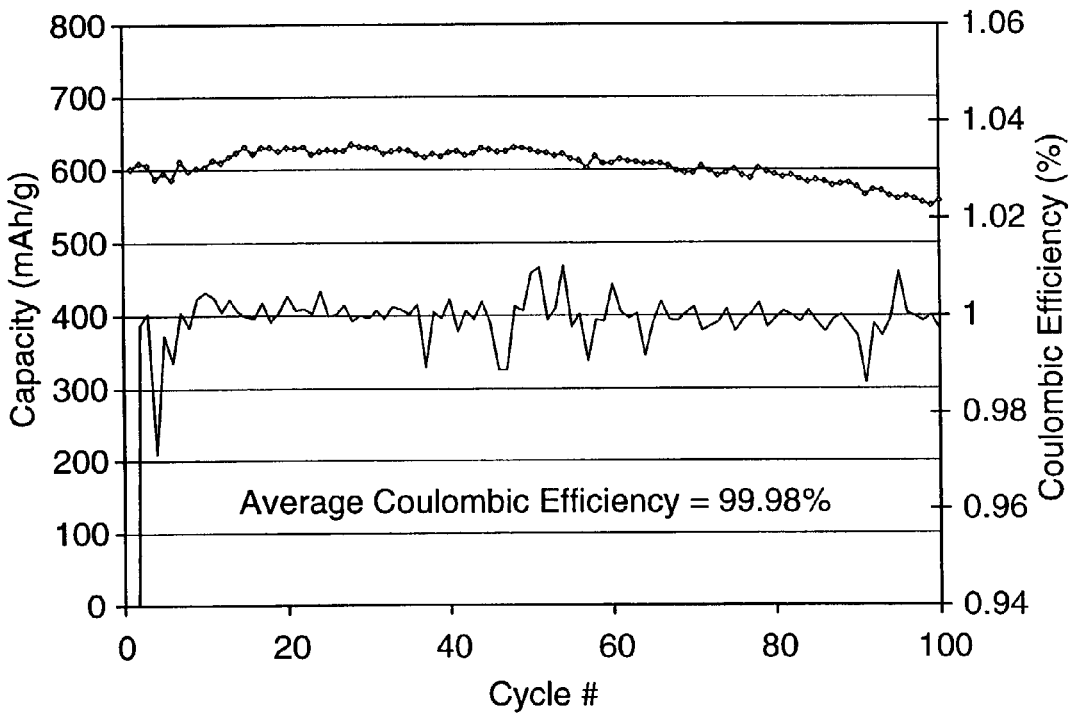
FIG. 4 shows a plot of charge capacity and coulombic efficiency versus cycle number for cells described in Example 7.

Half cells were produced and cycled as described in Example 6, except that the fluoroelastomer used was FC-2179 (available from Dyneon, LLC, Oakdale, Minn.). FIG. 4 shows the charge capacity and coulombic efficiency performance versus cycle number for the cells prepared in this example. As in the case of Example 6, good cycling performance was observed.

Comparative Example 4

Figure 5:
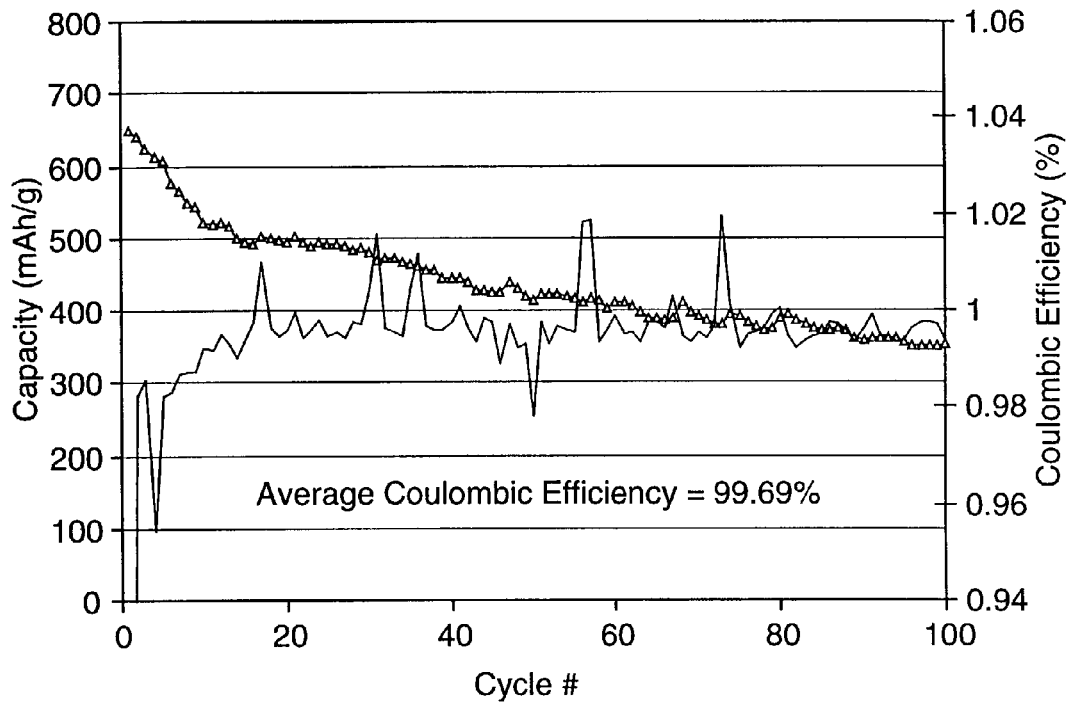
FIG. 5 shows a plot of charge capacity and coulombic efficiency versus cycle number for cells described in Comparative Example 4.

Half cells were produced and cycled as described in Example 7, except that the adhesion promoter was omitted. FIG. 5 shows a plot of charge capacity versus cycle number for the cells prepared in this example. The results demonstrate that performance decreases when the adhesion promoter is omitted.

Example 8

Figure 6:
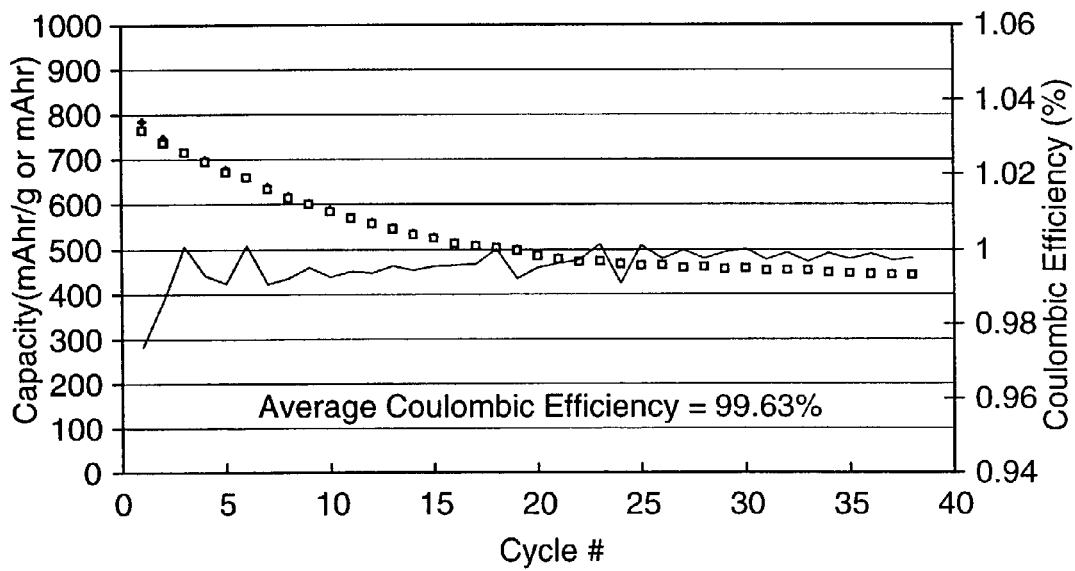
FIG. 6 shows a plot of charge capacity and coulombic efficiency versus cycle number for cells described in Example 8.

800 mg of silver-coated, amorphous Al/Si/Mn particles having an average particle size of <53 micron were stirred in 1 g MEK with 80 mg of 3-aminopropyltrimethoxysilane adhesion promoter for 2 days at ambient temperature. Next, 3.34 g of a 6% solids 70/30 SP carbon/FC2179 suspension (prepared as described in Example 7) were added. The mixture was stirred under high shear for 5 minutes, and then coated on a 12 micron Cu foil following the procedure of Example 1 to form a coated foil anode. Half cells were produced from the coated foil and cycled according to the procedure described in Example 6. FIG. 6 shows the charge capacity and coulombic efficiency performance versus cycle number for the cells prepared in this example. As in the case of the Si/Sn active particles prepared by sputtering, anodes prepared using melt-spun active particles, in combination with an adhesion promoter and elastomeric polymer binder, also exhibited good cycling performance.

Comparative Example 5

Figure 7:
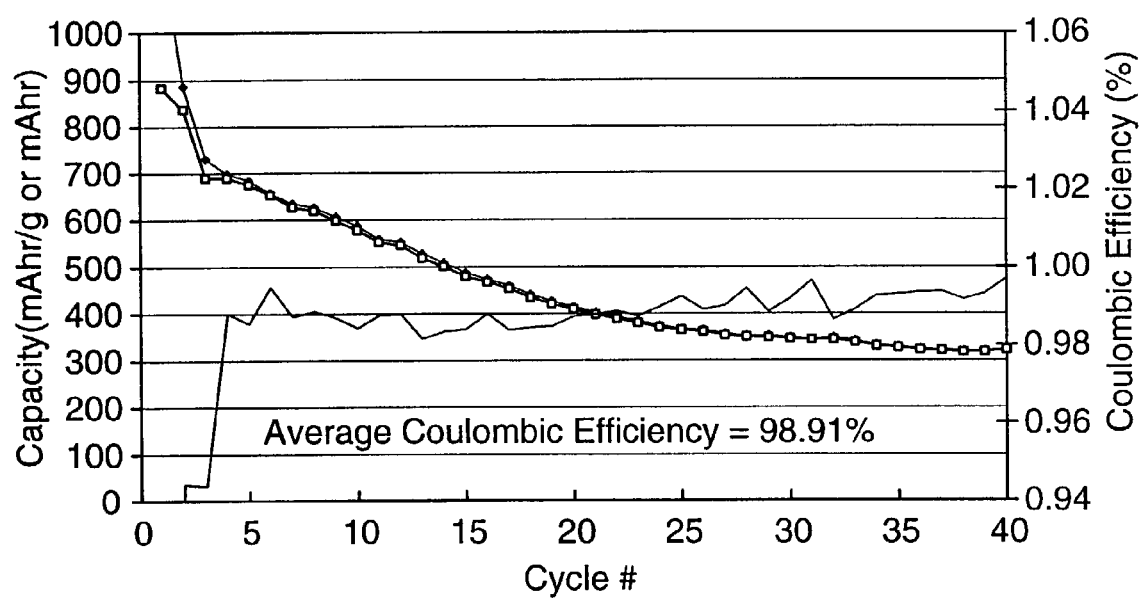
FIG. 7 shows a plot of charge capacity and coulombic efficiency versus cycle number for cells described in Comparative Example 5.

A reference coating without adhesion promoter was prepared and used to construct an anode as described in Example 8. Half cells were prepared using this anode and cycled under the same conditions. FIG. 7 shows the charge capacity and coulombic efficiency performance versus cycle number for the reference cells. The results demonstrate that omitting the adhesion promoter results in decreased performance.

A number of embodiments of the invention have been described. Nevertheless, it will be understood that various modifications may be made without departing from the spirit and scope of the invention.

What is claimed is:

1. A lithium ion battery comprising:
   (A) an anode comprising:
      (a) an elastomeric polymer binder;
      (b) an electrically conductive diluent dispersed in said binder;
      (c) a plurality of electrochemically active metal particles dispersed in said binder; and
      (d) an adhesion promoter that promotes adhesion among said particles, said electrically conductive diluent, and said binder;
   (B) a cathode; and
   (C) an electrolyte separating said electrode and said cathode.

2. A lithium ion battery according to claim 1, wherein said elastomeric binder comprises a fluoroelastomer binder.

3. A lithium ion battery according to claim 2, wherein said fluoroelastomer binder comprises units derived from monomers selected from the group consisting of olefins, fluoroolefins, perfluoroolefins, perfluoroalkyl vinyl ethers, perfluoroalkoxy vinyl ethers, and combinations thereof.

4. A lithium ion battery according to claim 2, wherein said fluoroelastomer binder comprises units derived from monomers selected from the group consisting of vinylidene fluoride, hexafluoropropylene, ethylene, propylene, and combinations thereof.

5. A lithium ion battery according to claim 1, wherein said binder comprises the reaction product of polymerizable reactants that include a crosslinking agent.

6. A lithium ion battery according to claim 1, wherein said adhesion promoter coats the surface of said electrochemically active metal particles.

7. A lithium ion battery according to claim 1, wherein said adhesion promoter is selected from the group consisting of silanes, titanates, phosphonates, and combinations thereof.

8. A lithium ion battery according to claim 1, wherein said electrochemically active metal particles comprise an electrochemically active metal selected from the group consisting of silver, aluminum, silicon, tin, antimony, lead, germanium, magnesium, zinc, cadmium, bismuth, and indium.

9. A lithium ion battery according to claim 8, wherein said electrochemically active metal particles comprise silicon.

10. A lithium ion battery according to claim 9, wherein said electrochemically active particles comprise amorphous silicon.

11. A lithium ion battery according to claim 1, wherein said electrochemically active metal particles further comprise an electrochemically inactive metal.

12. A lithium ion battery according to claim 11, wherein said electrochemically inactive metal is selected from the group consisting of molybdenum, niobium, tungsten, tantalum, iron, nickel, manganese, and copper.

13. A lithium ion battery according to claim 1, wherein said electrochemically active metal particles consist essentially of at least one electrochemically inactive metal and at least one electrochemically active metal in the form of an amorphous mixture at ambient temperature that remains amorphous when said anode composition is incorporated into a lithium battery and cycled though at least one full charge-discharge cycle at ambient temperature.

14. A lithium ion battery according to claim 1, wherein each of said electrochemically active metal particles includes an electrically conductive layer partially covering said particle.

15. A lithium ion battery according to claim 14, wherein said layer is present in an amount no greater than about 75 vol. % of said particle.

16. A lithium ion battery according to claim 14, wherein said layer is present in an amount no greater than about 75 wt. % of said particle.

17. A lithium ion battery according to claim 14, wherein said layer is porous.

18. A lithium ion battery according to claim 17, wherein said layer has a porosity of about 90%.

19. A lithium ion battery according to claim 14, wherein said layer comprises a metal.

20. A lithium ion battery according to claim 19, wherein said metal is selected from the group consisting of copper, chromium, nickel, silver, and combinations thereof.

21. A lithium ion battery according to claim 1, wherein said electrically conductive diluent comprises carbon black.

22. A lithium ion battery comprising:
   (A) an anode comprising:
   (a) a fluoroelastomer binder;
   (b) an electrically conductive diluent dispersed in said binder; and
   (c) a plurality of electroehemically active metal particles dispersed in said binder,
      said particles consisting essentially of (i) at least one electrochemically inactive metal and at least one electrochemically active metal in the form of an amorphous mixture at ambient temperature that remains amorphous when said anode composition is incorporated into a lithium battery and cycled through at least one full charge-discharge cycle at ambient temperature, and (ii) an electrically conductive layer partially covering each of said particles, said particles having a surface treated with an adhesion promoter that promotes adhesion among said particles, said electrically conductive diluent, and said binder;
   (B) a cathode; and
   (C) an electrolyte separating said anode and said cathode.

* * * * *